(12) United States Patent
Bergsieker et al.

(10) Patent No.: US 9,714,956 B2
(45) Date of Patent: Jul. 25, 2017

(54) TEST AND MEASUREMENT INSTRUMENT USER INTERFACE WITH MOVE MODE

(71) Applicant: Tektronix, Inc., Beaverton, OR (US)

(72) Inventors: Amy M. Bergsieker, Tigard, OR (US); Pechluck S. Laskey, Portland, OR (US); Joshua M. Kornfeld, Seattle, WA (US); Jared Randall, Seattle, WA (US); Jordan P. Evans, Seattle, WA (US); Jeffrey W. Ladwig, Seattle, WA (US)

(73) Assignee: Tektronix, Inc., Beaverton, OR (US)

( * ) Notice: Subject to any disclaimer, the term of this patent is extended or adjusted under 35 U.S.C. 154(b) by 268 days.

(21) Appl. No.: 13/714,296

(22) Filed: Dec. 13, 2012

(65) Prior Publication Data
US 2014/0168053 A1     Jun. 19, 2014

(51) Int. Cl.
| | | |
|---|---|---|
| *G06F 3/0486* | (2013.01) | |
| *G06F 3/048* | (2013.01) | |
| *G06F 3/0484* | (2013.01) | |
| *G01R 13/02* | (2006.01) | |
| *G06F 3/0481* | (2013.01) | |

(52) U.S. Cl.
CPC ........... *G01R 13/02* (2013.01); *G06F 3/0481* (2013.01); *G06F 3/0486* (2013.01)

(58) Field of Classification Search
None
See application file for complete search history.

(56) References Cited

U.S. PATENT DOCUMENTS

| | | | | |
|---|---|---|---|---|
| 5,801,953 | A * | 9/1998 | Thoma et al. | 702/68 |
| 6,008,809 | A * | 12/1999 | Brooks | 715/792 |
| 6,054,984 | A | 4/2000 | Alexander | |
| 6,166,736 | A * | 12/2000 | Hugh | 715/798 |
| 6,556,202 | B1 * | 4/2003 | Taraki et al. | 345/440.1 |
| 6,559,868 | B2 * | 5/2003 | Alexander et al. | 715/781 |

(Continued)

OTHER PUBLICATIONS

National Instruments Tutorial entitled, TestStand 4.0 Accelerating Test System Development, May 9, 2012.

*Primary Examiner* — Matthew Ell
*Assistant Examiner* — Nhat-Huy T Nguyen
(74) *Attorney, Agent, or Firm* — Michael A. Nelson; Kevin D. Dothager; Marger Johnson

(57) ABSTRACT

An apparatus, system, and method are described for providing an intuitive user interface on a test and measurement instrument. The test and measurement instrument can include container logic, which provides a work mode in which interactions with objects within a container on a display are allowed, and a move mode in which interactions with the objects within the container on the display are temporarily prevented. When in the move mode, the container logic can detect a dragging gesture associated with the container. In response to the dragging gesture, a preview container arrangement is provided overlaying the container arrangement. The container logic can detect a dropping indication, thereby causing the arrangement to snap to the preview container arrangement. Various other user interface controls are provided while in the move mode. In multi-user environments, customized container arrangements may be saved and then later recalled. Containers may be moved among multiple different displays.

28 Claims, 10 Drawing Sheets

(56) References Cited

U.S. PATENT DOCUMENTS

| | | | |
|---|---|---|---|
| 7,752,566 B1* | 7/2010 | Nelson | 715/769 |
| 8,006,195 B1* | 8/2011 | Woodings et al. | 715/777 |
| 2005/0108620 A1* | 5/2005 | Allyn et al. | 715/500 |
| 2005/0235316 A1* | 10/2005 | Ahmad-Taylor | 725/44 |
| 2007/0257895 A1* | 11/2007 | Tolaio | G06F 3/0488 345/173 |
| 2009/0320004 A1 | 12/2009 | Fertitta | |
| 2010/0310004 A1 | 12/2010 | Li et al. | |
| 2012/0005607 A1* | 1/2012 | Tofinetti et al. | 715/769 |

\* cited by examiner

TEST AND MEASUREMENT INSTRUMENT USER INTERFACE WITH MOVE MODE

BACKGROUND

Embodiments of the present invention relate to test and measurement instruments, and more particularly, to a test and measurement instrument including a user interface having a move mode.

Conventional test and measurement instruments, such as oscilloscopes, spectrum analyzers, and the like, offer few capabilities for adjusting the user interface. For example, it is difficult or impossible to rearrange or resize different parts of the user interface on the display. Although current user interface paradigms exist in general purpose computers and mobile devices, such paradigms are not well suited for test and measurement instruments. The various windows on such paradigms are quite often not related to each other. In contrast, the windows or waveform containers of a test and measurement instrument usually have some common relationship to the workspace. Moreover, test and measurement instruments are often located on benches that are not level with the end-user. Sometimes they are located high on a shelf. In addition, when taking measurement in the field, for example, the test and measurement instruments may be located in a vehicle or in other difficult settings.

Furthermore, the workspace on the display of a test and measurement instrument can include a variety of user-settable criteria, data objects, trigger points, measurement information, and the like, which in the case of a traditional user interface, can accidentally be erased or altered when attempting to manipulate the windows or containers in the workspace. Such accidental alterations to the workspace can result in inaccurate waveform measurements, lost time, or in some cases, even catastrophic system failures due to misunderstandings or inexact analysis of waveforms associated with the system being measured.

Accordingly, there remains a need for providing an improved user interface designed particularly for test and measurement instruments. What is needed is an intuitive touch screen and/or mouse activated interface, which provides sufficient flexibility to arrange the layout of the waveform views and related information in a manner that is easily controlled by the end-user, even in less-than-ideal environments, while ensuring that settings and other information are not unintentionally erased or altered. Embodiments of the invention address these and other limitations in the prior art.

The foregoing and other features and advantages of the inventive concepts will become more readily apparent from the following detailed description of the example embodiments, which proceeds with reference to the accompanying drawings.

DETAILED DESCRIPTION

Reference will now be made in detail to embodiments of the present invention, examples of which are illustrated in the accompanying drawings. In the following detailed description, numerous specific details are set forth to enable a thorough understanding of the inventive concepts. It should be understood, however, that persons having ordinary skill in the art may practice the inventive concepts without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first container could be termed a second container, and, similarly, a second container could be termed a first container, without departing from the scope of the inventive concept.

The terminology used in the description of the various embodiments herein is for the purpose of describing particular embodiments only and is not intended to be limiting of the inventive concepts. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Reference is made herein to a test and measurement instrument. The test and measurement instrument can implement or include various example embodiments of the present invention, which can be applied in a variety of ways and to a variety of different applications, including for example, the management of containers of a user interface. The containers can include one or more waveforms associated with acquired input signal data. The acquired signals can be associated with, for example, high-frequency wired or wireless communication systems, high-speed memory or other logic circuits, storage devices, networks, and so forth.

Figure 1:
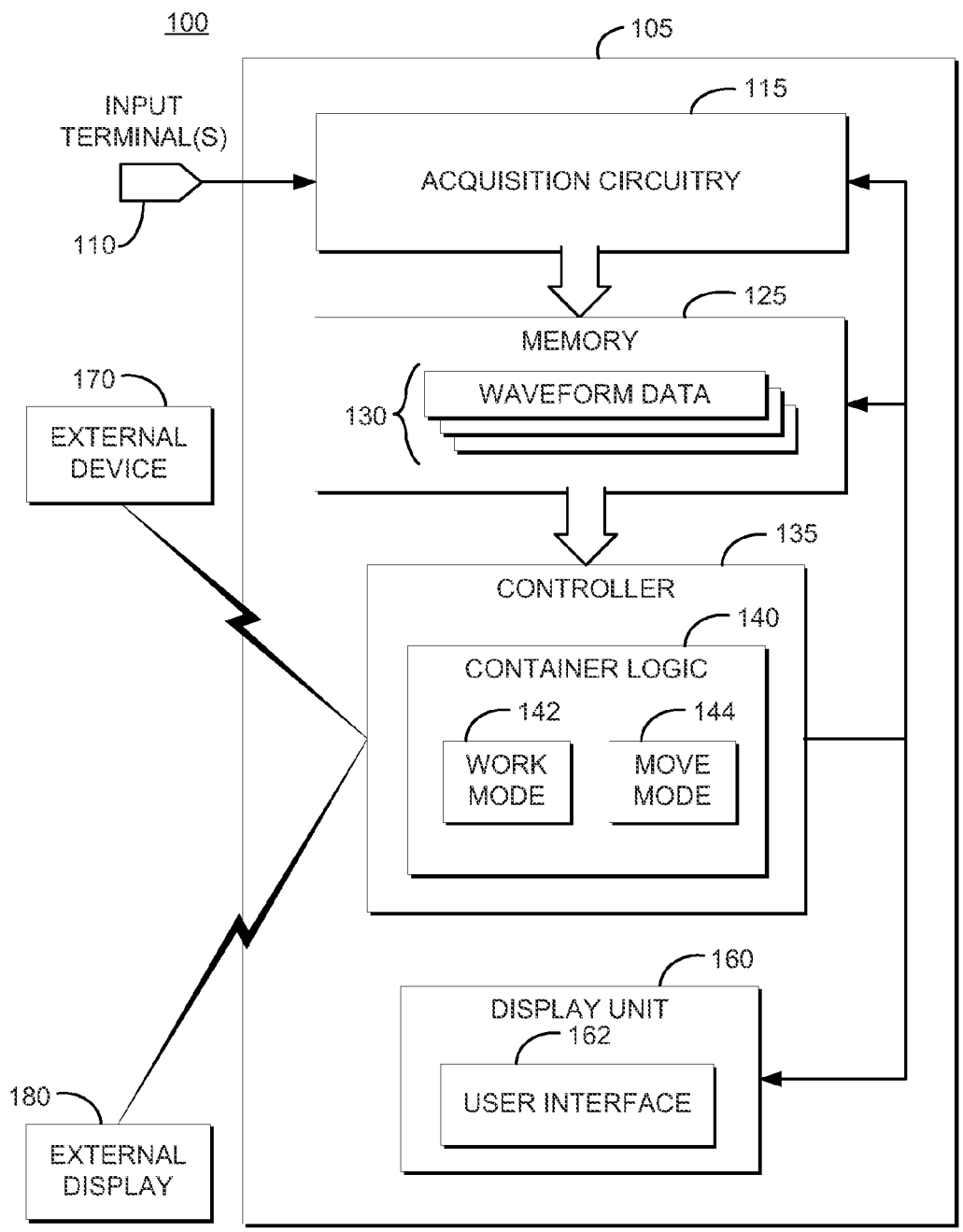
FIG. 1 illustrates a simplified block diagram of one embodiment of a test and measurement instrument, including container logic, according to embodiments of the present invention.

FIG. 1 illustrates a simplified block diagram 100 of one embodiment of an apparatus or system, which may include an oscilloscope 105. In alternative embodiments, the apparatus or system 100 may include a spectrum analyzer, a signal analyzer, some combination of the two, or another type of comparable test and measurement instrument or device or a simulation of such system whose function(s) is (are) substantially the same as the that of 100. For the sake of consistency and explanation, the test and measurement instrument will be referred to herein as an oscilloscope 105.

In accordance with embodiments of the present invention, the oscilloscope 105 may include container logic 140. The system 100 may implement or include various exemplary embodiments of the present invention, which may be applied in a variety of ways and in a variety of different applications, including for example, the management of an intuitive user interface 162, which facilitates moving windows or containers of objects (e.g., waveforms, trigger settings, measurement information, and the like) and other related information without accidental alterations or corruption. The waveforms can be associated with, for example, high-frequency wired or wireless communication systems, high-speed memory or other logic circuits, storage devices, networks, simulated data, and so forth.

In one embodiment, the oscilloscope 105 can include, for example, one or more input means (for example, terminals 110), acquisition means or circuitry 115, storage medium (e.g., memory 125), a controller 135 (including the container logic 140), and a display unit 160. The controller 135, and more specifically the container logic 140, alone or in combination with other components of the oscilloscope 105, can implement or cause to be implemented any of the various embodiments of the present invention.

The oscilloscope 105 may have one, two, four, or any number of channels that are connected to input means 110, suitable for use with various embodiments as described herein. While components of the oscilloscope 105 are shown to be directly coupled to each other, it should be understood that the oscilloscope 105 can include a variety of other circuit or software components, inputs, outputs, and/or interfaces, which are not necessarily shown, but that are disposed between or otherwise associated with the illustrated components of oscilloscope 105.

One or more actual or simulated, analog or digital waveforms or electrical signals (collectively referred to as "signals") can be received at the input means 110. Acquisition circuitry 115 may include, for example, known electronic circuitry and/or devices for at least receiving the signals from terminals 110, sampling the signals, and converting the signals into digitized samples. The "acquired data" can then be stored in the memory 125 as waveform data 130. As used herein, the term "acquired data" will be understood to include the reception of an original input signal, sampling of such a signal, and the conversion of such a signal into digital samples or bits when the signal is an analog signal.

The memory 125 may be any suitable recordable medium or storage medium capable of storing the acquired data, including the waveform data 130. The memory 125 can take the form of RAM, ROM, and/or cache memory. RAM memory may be operable to store volatile data, such as the acquired data and corresponding waveform data 130 generated by the acquisition circuitry 115. The memory 125 can store executable instructions that may be accessed by the controller 135. Alternatively, the acquired data, corresponding waveform data 130, and/or executable instructions may be stored in a recordable medium separate from the memory 125.

The controller 135 can be operatively coupled to the memory 125 and the display unit 160. The controller 135, and in particular the container logic 140, may be operable to access and process the data from the memory 125 in order to implement an intuitive user interface 162 with moveable containers of information, as described in detail below, and all of the inventive methods and processes described herein, any of which may be displayed by the display unit 160.

As indicated above, the controller 135 can include the container logic 140. The container logic 140 can facilitate at least two distinct modes: a work mode 142 and a move mode 144. While in the work mode, interactions with work objects (e.g., waveforms, trigger settings, measurement information, and the like) are allowed. Conversely, while in the move mode, interactions with the work objects within that particular container (and/or adjacent or related containers) are temporarily prevented or otherwise disabled or grayed out. In this manner, accidental alterations, measurement mistakes, corruption of waveform data, and the like, are avoided. Moreover, while in the move mode, waveform containers (e.g., windows) can be easily arranged according to the desires of the user, even if the oscilloscope is not ideally situated in front of the user. These and other features and inventive aspects are described in further detail below.

Components of the controller 135 and/or the container logic 140 may take the form of, or be implemented using hardware, software, firmware, or by any combination thereof. For example, executable instructions for implementing the inventive methods and processes described herein and for otherwise controlling the oscilloscope 105 may be stored and accessed from the memory 125. The controller 135 may be implemented as, for example, one or more programmable microprocessors, such as those designed and developed by Intel Corporation; or multiple programmable digital signal processors (which may be collectively referred to as "controller" or "controllers" herein). In yet another embodiment, when the controller 135 is implemented using multiple controllers, one may be used to control the acquisition and processing of input signals while the second may control the other operations of the oscilloscope 105. The oscilloscope 105 may be further controlled using a Windows® Operating System, designed and developed by Microsoft Corporation that is stored, for example, within associated memory 125 and accessed, for example, by one or more controllers 135.

In some embodiments, the controller 135 can exchange information related to the user interface 162 and associated containers with external device 170 via a conductor such as a bus or a wire. The external device 170 can include, for example, a computer separate from the oscilloscope 105, or an external memory device (e.g., mass storage unit), among other possibilities. The controller 135 can transmit information about the user interface 162 or waveform data 130 to the external device 170, and/or receive information from the external device 170 to enhance the user interface 162 using the oscilloscope 105.

Moreover, the controller 135 can exchange information related to the user interface 162 and associated containers with external display 180 via a conductor such as a bus or a wire. The controller 135 can transmit information about the user interface 162 or waveform data 130 to the external display 180, as further described in detail below, and/or receive information from the external display 180 to enhance the user interface 162 using the oscilloscope 105.

FIGS. 2-8 illustrate a series of example displays including two containers (e.g., 'A' and 'B') of a user interface 162 and associated operations by the container logic 140 (of FIG. 1), according to embodiments of the present invention.

Figure 2:
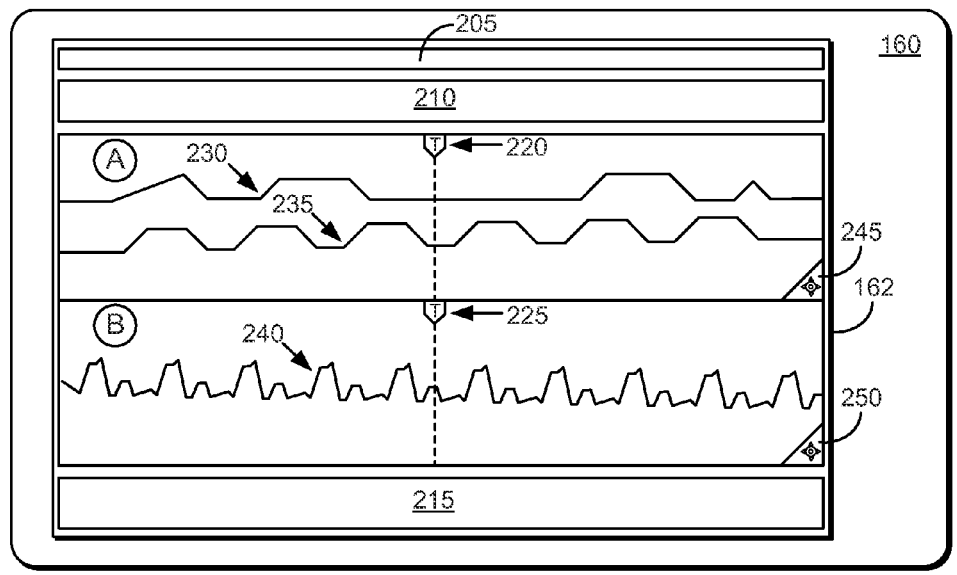
FIGS. 2-8 illustrate a series of example displays including two containers of a user interface and associated operations by the container logic, according to embodiments of the present invention.

Referring to FIG. 2, the display unit 160 may include a display or user interface 162. The user interface 162 may include various regions. For example, the user interface 162 may include a menu region 205 having various drop-down menus with various options. The user interface 162 may also include a tool region 210 in which various frequently-used tools and buttons are made available to the user, such as a cursor tool, a trigger setting tool, scaling controls, measurement controls, find tools, and the like. The user interface 162 may also include a tray region 215 in which various other controls and information are made available to the user, such as calibration controls, channel selection, run and stop controls, scope specific controls, and the like.

In particular, the user interface 162 can include waveform windows or containers, for example, labeled 'A' and 'B.' Such labels need not actually be present and are used here to facilitate this description. As can be seen, container 'A' includes two waveforms, i.e., waveforms 230 and 235. Container 'B' includes one waveform, i.e., waveform 240. It will be understood that any number of waveforms can be displayed within each container.

As can also be seen, trigger indicators 220 and 225 are present in each of the waveform containers 'A' and B, respectively. It will be understood that other information can be present within the containers. For example, cursors, measurements, notations, graticules, waveform data, and the like (not shown) can be included within one or more of the containers. Such objects can be manipulated when in a work mode (e.g., 142 of FIG. 1), but can be temporarily protected or grayed out during a move mode (e.g., 144 of FIG. 1), as further explained below.

In accordance with embodiments of the present invention, the container logic 140 (of FIG. 1) can provide the work mode 142 in which interactions with the objects (e.g., the waveforms, cursors, measurements, notations, graticules, and the like) within the containers on the display are allowed. The container logic 140 (of FIG. 1) can also provide the move mode 144 in which interactions with the objects within the containers on the display are temporarily prevented.

In some embodiments, move action corners 245 and 250 can be disposed in lower right hand regions of the containers 'A' and B, respectively. The move action corners can be displayed in the containers when in the work mode 142 and/or when in the move mode 144.

Figure 3:
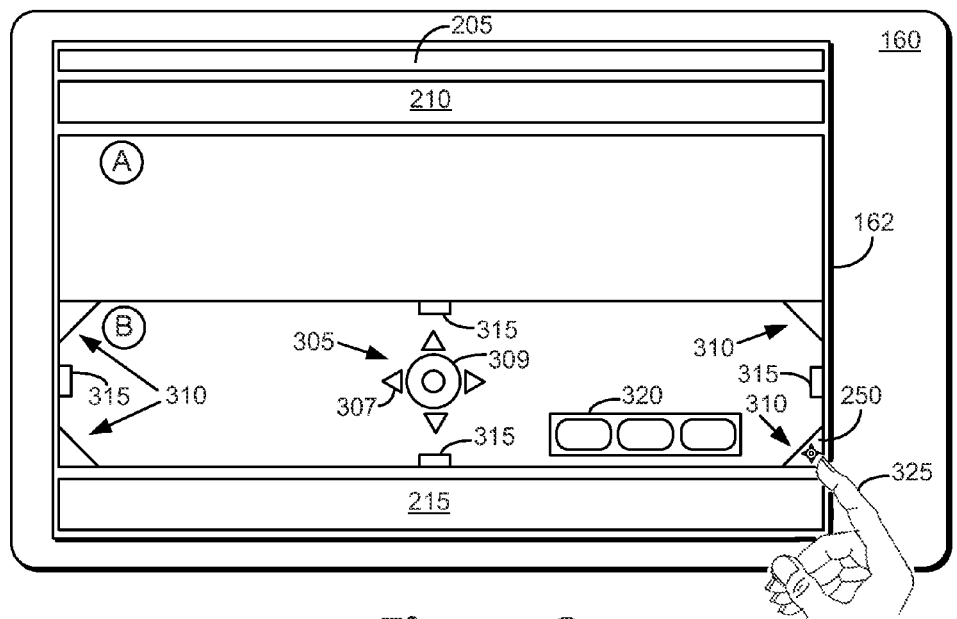

Reference is now made to FIG. 3. The containers 'A' and 'B' are part of a container arrangement. As shown in FIG. 3, the containers can be arranged horizontally and stacked one atop another. In FIG. 3 and other figures, some of the objects described above are not shown for the sake of simplifying the explanation. Such objects can actually be present, either in the foreground or the background (grayed out), within the various modes described herein.

The container logic 140 can detect a toggle indication by detecting a selection of the move action corner 250. The selection can be made by touch 325, by a mouse (not shown), or by any other suitable selection means. The container logic 140 can cause the user interface 162 and/or the specific container 'B' to toggle between the work mode 142 and the move mode 144 in response to the toggle indication. It will be understood that in any and all of the embodiments discussed herein, selections and gestures in connection with the user interface 162 can be made by touch, by mouse, or by any other suitable selection or gesture means. It will also be understood that the move mode 144 can alternatively or additionally be invoked from the menu 205, the tool region 210, and/or the tray region 215.

When the move mode 144 is toggled on, various move mode controls appear. For example, when in the move mode, the container logic 140 can provide a move control icon 305 within the container 'B' (i.e., the container that is toggled to the move mode). The move control icon 305 can include a graphical center portion 309, which can be a graphical target or other suitable graphic disposed within a center region of the container. The graphical target shape is inviting and can persuade the user to want to click or touch the target. The move control icon 305 can also include graphical arrow portions 307. The operations of the center portion 309 and the arrows 307 are described in further detail below.

Additional controls that appear while in the move mode can include one or more scale handle icons 315 and one or more scale corner handles 310, which can be used to scale the various containers, as also described in further detail below. By enacting the move mode, any container can be moved, not just the container that invoked the move mode. In this fashion, the workspace can be configured as desired with all of the containers. The various controls appear in the container that is in focus. In other words, while in FIG. 3 the various controls are shown in container 'B,' which is the container that invoked the move mode, and is the container that is presently in focus—the user can also click anywhere within container 'A,' which would bring that container into focus, and can cause the various move mode and other controls to appear in that container and not in the container 'B.' The move controls appear in whichever movable container is in focus until move mode is toggled off.

Further, the controls that appear can include one or more button icons (e.g., 320). In response to a selection of one of the buttons, the container logic 140 can perform an action on the selected container or the group of containers. For example, selection of a button 320 by the user can cause the containers to be automatically arranged horizontally, vertically, or in some other pre-set arrangement. By way of another example, selection of a button 320 may cause a grid to appear or disappear.

By way of yet another example, selection of one of the buttons 320 can indicate a desire to save a container arrangement, which can cause the container logic 140 to save the container arrangement for later recall. This is particularly useful in multi-user environments where multiple users share a single oscilloscope. The user can indicate their desire to recall a particular container arrangement by selecting a recall button 320, thereby causing the container logic 140 to recall the saved container arrangement. It will be understood that the operations described herein in connection with the one or more buttons 320 can also be invoked from the menu 205, the tool region 210, and/or the tray region 215. It is advantageous and convenient for the user, however, to provide tools and options within the container particularly when the options are specific to that container or to a given mode.

Figure 4:
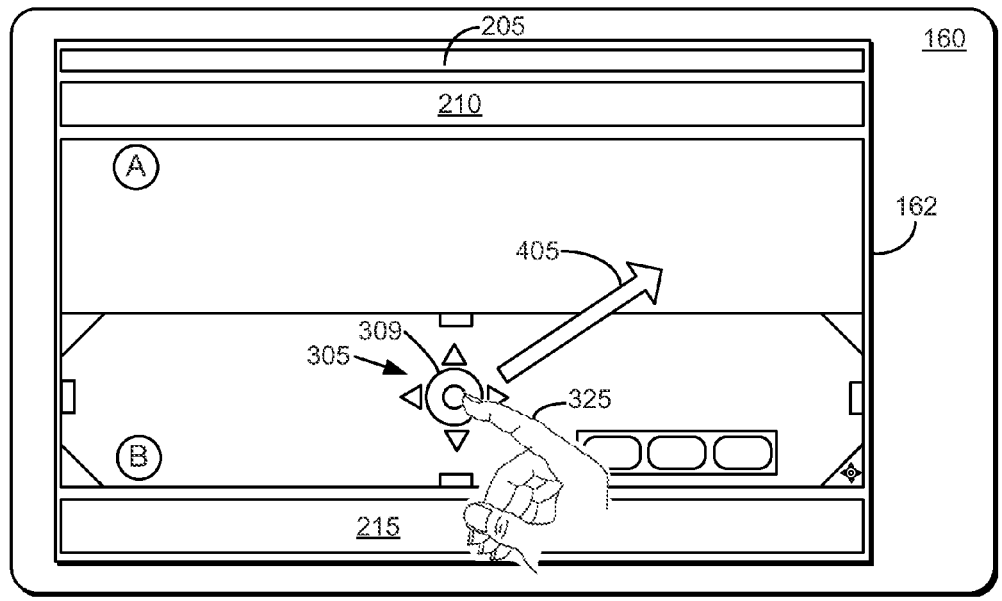

Referring now to FIG. 4, the containers 'A' and 'B' are part of an arrangement of containers. When in the move mode 144, interactions with work objects in the container 'B' are prevented or otherwise grayed out, and the container logic 140 can detect a dragging gesture 405, for example, associated with the container 'B.' For example, the user can press their finger 325 on the center portion 309 of the move control icon 305, and make a dragging gesture.

Figure 5:
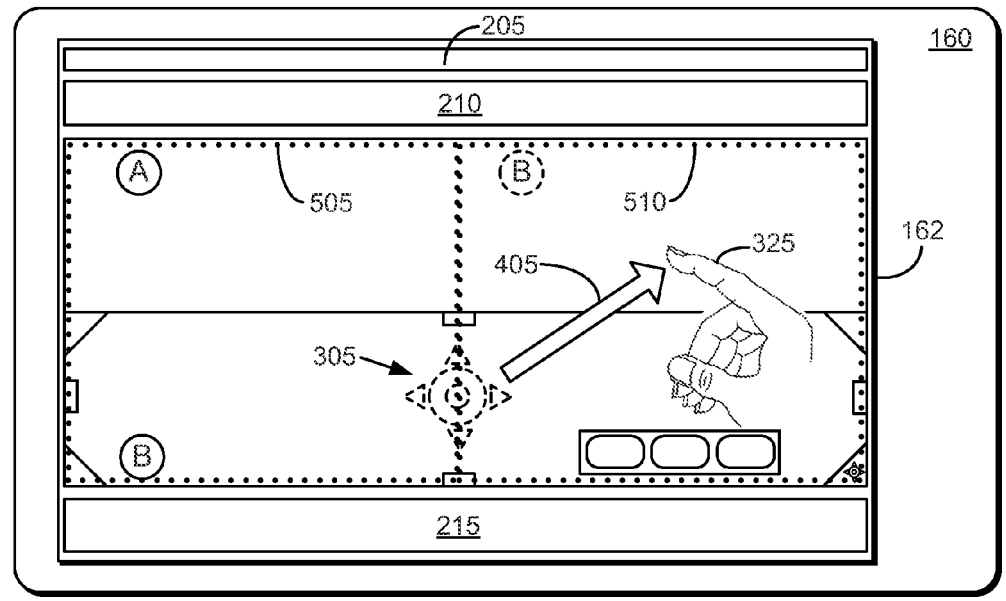

Referring now to FIG. 5, in response to the dragging gesture 405, the container logic 140 can provide a preview container arrangement (e.g., including preview container 505 and preview container 510) overlaying the current container arrangement. The container logic 140 provides an educated guess as to how the user intends to re-arrange the containers. In this example, both of the preview containers 505 and 510 are resized relative to the current containers 'A' and 'B.' Alternatively, the container 'B' (i.e., the container being dragged) can retain its current size and shape, and any other containers (e.g., container 'A') can be resized and/or repositioned in the preview to accommodate the current size and shape of container 'B.'

As mentioned above, any selections or other such gestures described herein can also be made using a mouse or other suitable means. If the display is a touch-sensitive display, then the dragging gesture can be detected from an end-user on the touch-sensitive display. Alternatively, or in addition, the dragging gesture can also be detected as a mouse gesture from the end-user. For the sake of simplicity, the gestures will generally be described herein with reference to the finger 325 and the display assumed to be a touch-sensitive display.

Figure 6:
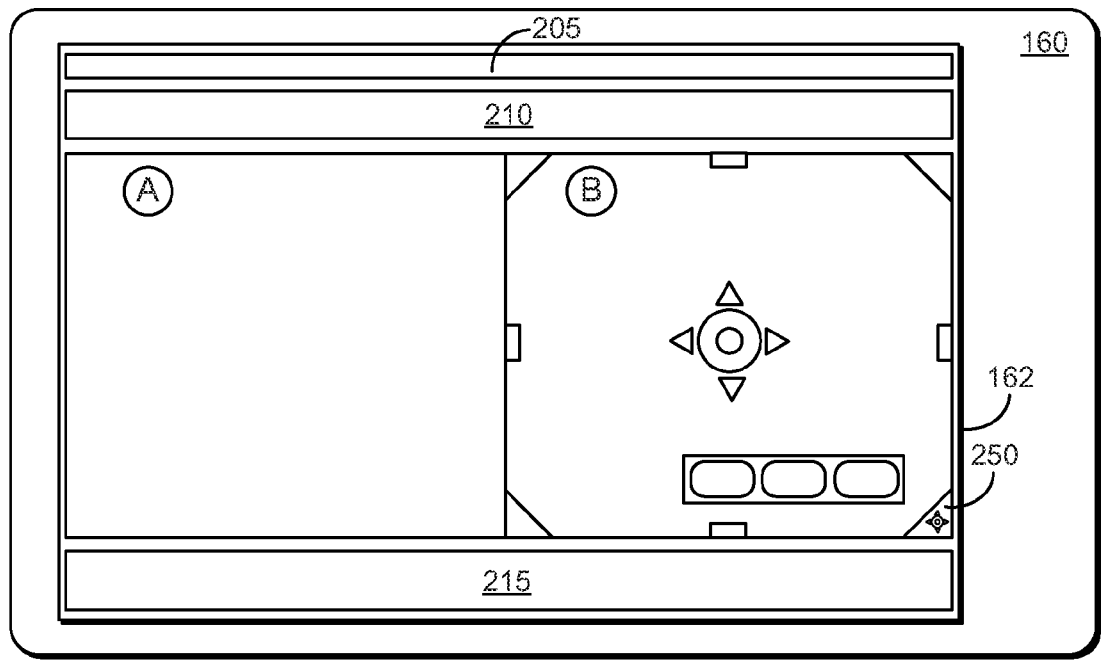

Referring now to FIGS. 5 and 6, the container logic 140 can detect a dropping indication or gesture. For example, the finger 325 can be lifted from the display (or the mouse un-clicked). In response to the dropping indication, the container arrangement can be snapped to the preview container arrangement. In other words, the container 'B' can automatically take the size, shape and location of the preview container 510 and the container 'A' can automatically take the size, shape and location of the preview container 505.

Still in the move mode 144, the user can again move the container 'B' to another location by manipulating the move action icon 305. In addition, the user can operate other move mode controls. Otherwise, if the user is satisfied with the new container arrangement, the user can toggle out of move mode by selecting or pressing the move action corner 250.

Figure 7:
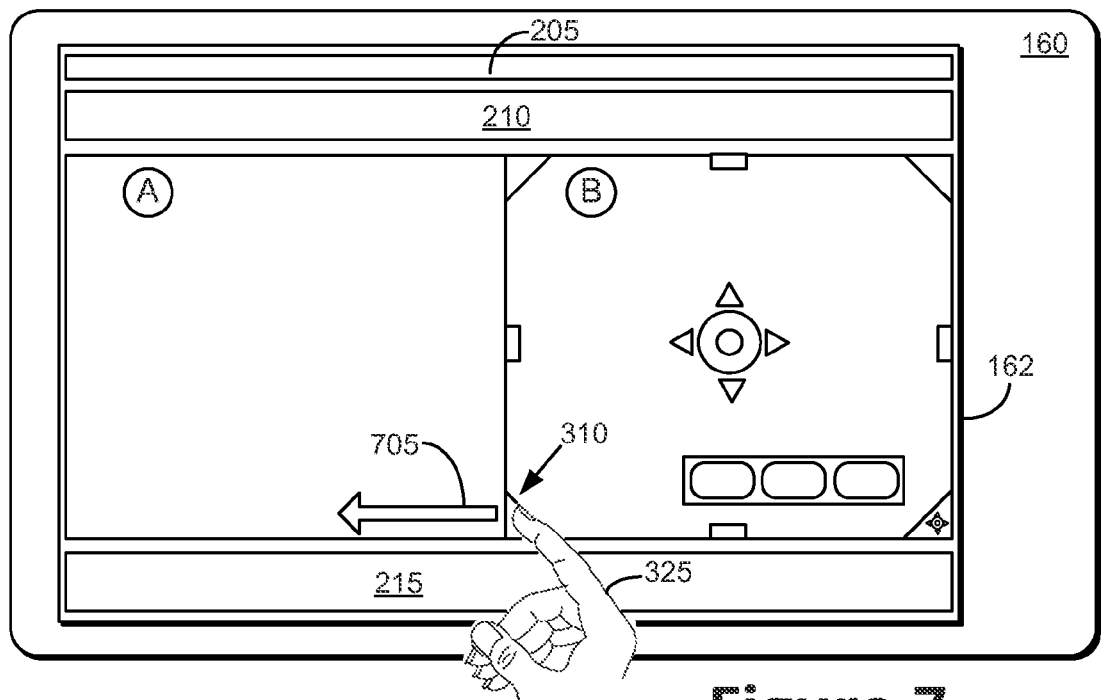

Referring now to FIG. 7, and assuming that the user has not toggled out of the move mode 144, the container logic 140 can detect a selection and dragging gesture 705 of one of the scale corner handles 310. In response to the selection and the dragging gesture, both of the containers 'A' and 'B' can be graphically scaled.

Figure 8:
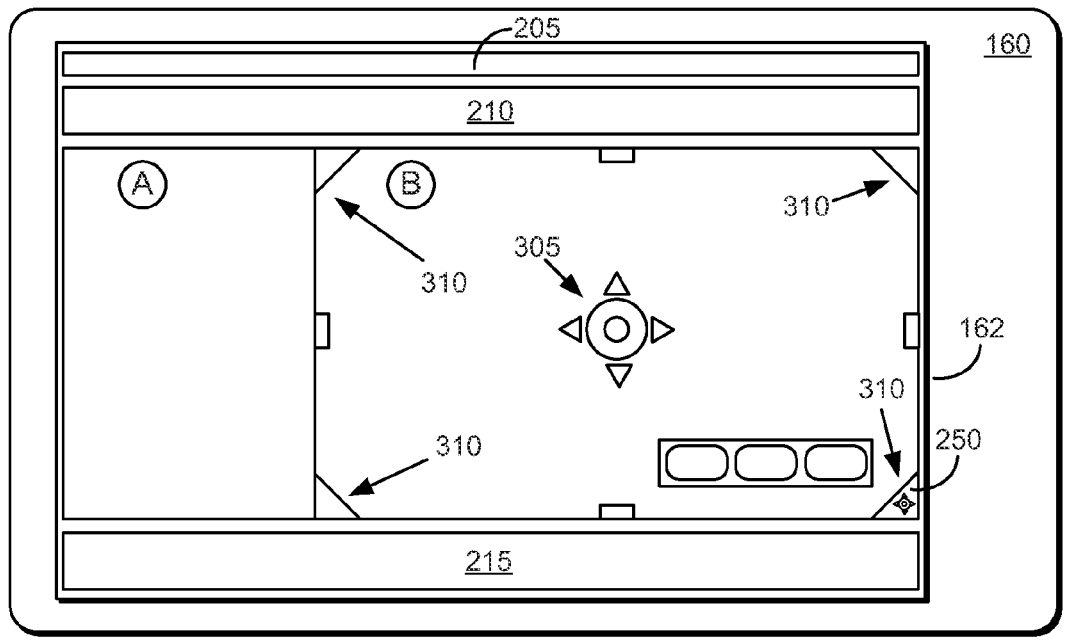

FIG. 8 shows how the containers 'A' and 'B' would appear after the selection and the dragging gesture of the scale corner handle 310. In other words, both the container 'B' and the adjacent container 'A' can be simultaneously scaled in response to the selection and the dragging gesture using the scale corner handle 310. All containers are scalable to any suitable size, which allows for flexibility in the layout and the workspace. The layouts need not be fixed to particular options or rigid rules.

The scale corner handles 310 and the scale handle icons 315 can be used in a similar way. For example, the scale corner handles 310 or the scale handle icons 315 can be selected and dragged in any direction (e.g., up, down, left, right, diagonal) in order to resize the associated container(s). The adjacent containers can be automatically and simultaneously resized relative to the dragging of the scale corner handle(s) 310 or the scale handle icon(s) 315 of the presently selected container. The lower right hand scale corner handle 310 can double as the move action corner 250. In other words, the lower right hand corner can function as the move action corner 250, the scale corner handle 310, or both.

FIGS. 9-18 illustrate a series of example displays including three containers (e.g., 'A,' 'B,' and 'C') of a user interface 162 and associated operations by the container logic 140 (of FIG. 1), according to embodiments of the present invention. Some of the components and aspects of FIGS. 9-18 are present in FIGS. 2-8 as explained above, and for the sake of brevity, a detailed description of these is not repeated. The primary difference is the presence of three containers instead of two containers. It will be understood that any number of containers can be present and still fall within the inventive aspects disclosed herein.

Figure 9:
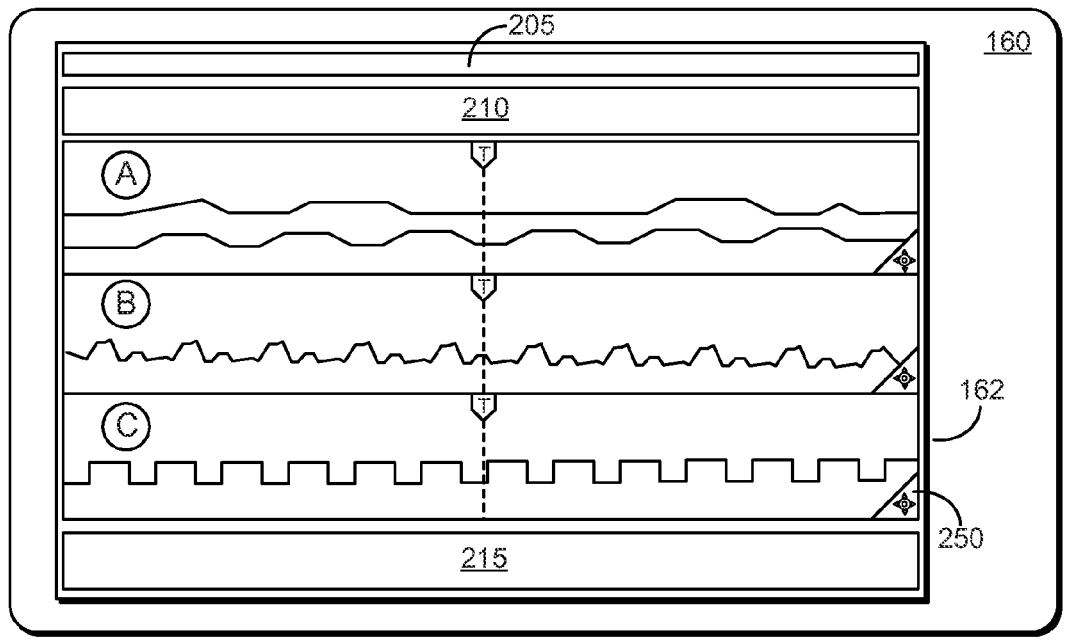
FIGS. 9-18 illustrate a series of example displays including three containers of a user interface and associated operations by the container logic, according to embodiments of the present invention.

Referring to FIG. 9, the user interface 162 can include waveform windows or containers, for example, labeled 'A,' and 'B,' and 'C.' Such labels need not actually be present and are used here to facilitate this description. As can be seen, each container can include one or more waveforms.

In accordance with embodiments of the present invention, the container logic 140 (of FIG. 1) can provide the work mode 142 in which interactions with the objects (e.g., the waveforms, cursors, measurements, notations, graticules, and the like) within the containers on the display are allowed. The container logic 140 can also provide the move mode 144 in which interactions with the work objects (i.e., the non-move-mode objects) within the containers on the display are temporarily prevented.

In some embodiments, move action corners (e.g., 250) can be disposed in lower right hand regions of the containers 'A' and 'B,' and 'C' respectively. The move action corners can be displayed in the containers when in the work mode 142 and/or when in the move mode 144.

Figure 10:
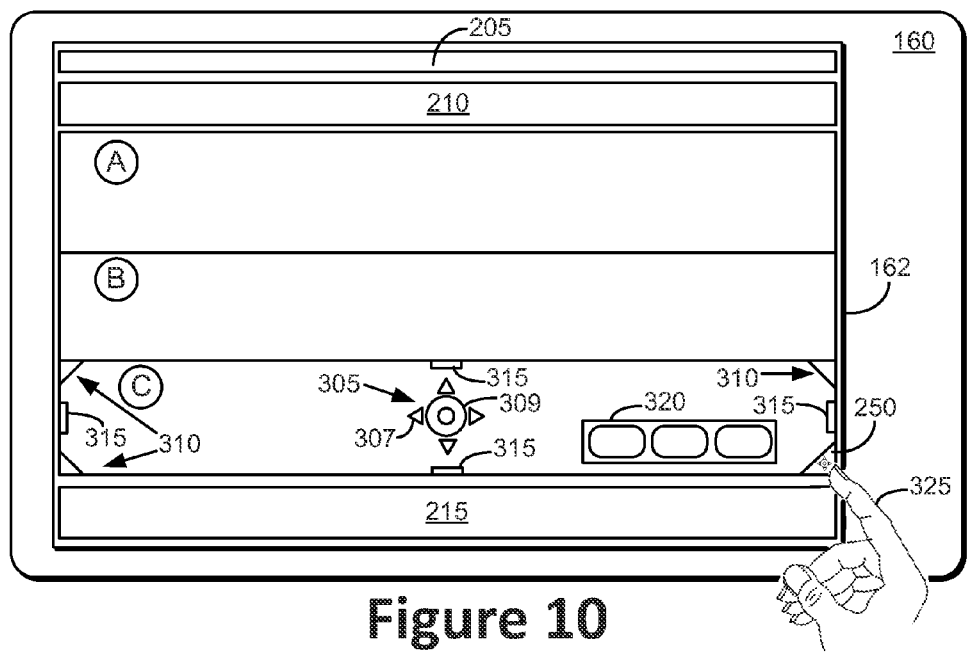

Reference is now made to FIG. 10. The containers 'A,' 'B,' and 'C' are part of a container arrangement. As shown in FIG. 10, the containers can be arranged horizontally and stacked one atop another. The container logic 140 can detect a toggle indication by detecting a selection of the move action corner 250. The container logic 140 can cause the user interface 162 and/or the selected container 'C' to toggle between the work mode 142 and the move mode 144 in response to the toggle indication. It will be understood that the move mode 144 can alternatively or additionally be invoked from the menu 205, the tool region 210, and/or the tray region 215.

When the move mode 144 is toggled on, various controls appear within the container. For example, when in the move mode, the container logic 140 can provide a move control icon 305 within the container 'C' (i.e., the container that is toggled to the move mode). The move control icon 305 can include a graphical center portion 309, which can be a graphical target or other suitable graphic disposed within a center region of the container. The move control icon 305 can also include graphical arrow portions 307. The operations of the center portion 309 and the arrows 307 are described in further detail below.

Additional controls that appear while in the move mode can include one or more scale handle icons 315 and one or more scale corner handles 310, which can be used to scale the various containers, as also described in further detail below. As mentioned above, by enacting the move mode, any container can be moved, not just the container that invoked the move mode. In this fashion, the workspace can be configured as desired with all of the containers. The various controls appear in the container that is in focus. In other words, while in FIG. 3 the various controls are shown in container 'C,' which is the container that invoked the move mode, and is the container that is presently in focus—the user can also click anywhere within container 'A' or 'B,' which would bring that container into focus, and can cause the various move mode and other controls to appear in that container and not in the container 'C.' The move controls appear in whichever movable container is in focus until move mode is toggled off.

Further, the controls that appear can include one or more button icons (e.g., 320). In response to a selection of one of the buttons, the container logic 140 can perform actions on the selected container or the group of containers such as the actions and operations described above.

Figure 11:
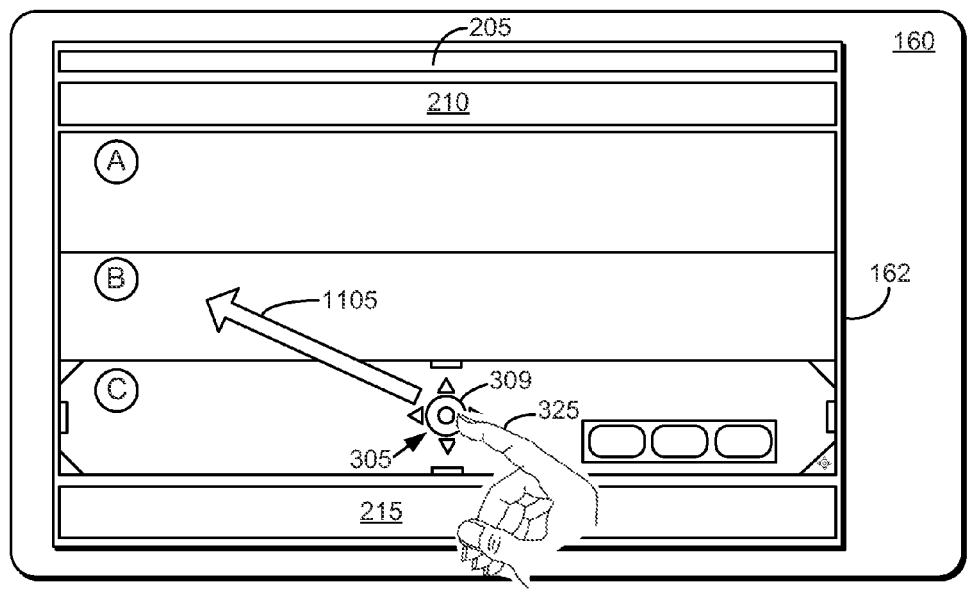

Referring now to FIG. 11, the containers 'A,' 'B,' and 'C' are part of an arrangement of containers. When in the move mode 144, interactions with work objects in the container 'C' (and optionally the other containers as well) are prevented or otherwise grayed out, and the container logic 140 can detect a dragging gesture 1105, for example, associated with the container 'C.' For example, the user can press their finger 325 on the center portion 309 of the move control icon 305, and make a dragging gesture.

Figure 12:
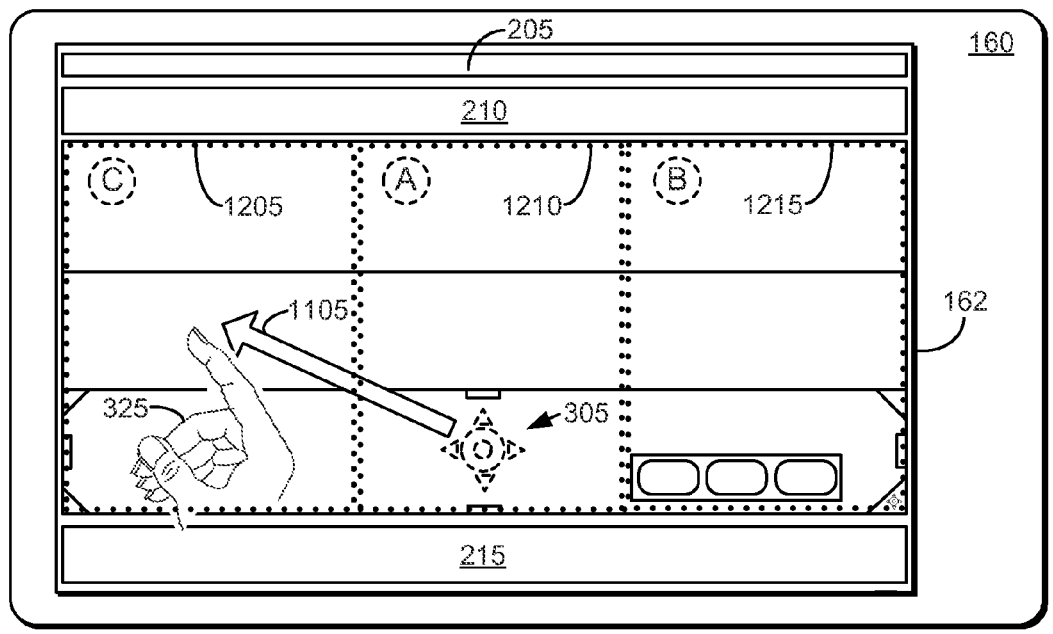

Referring now to FIG. 12, in response to the dragging gesture 1105, the container logic 140 can provide a preview container arrangement (e.g., including preview container 1205, preview container 1210, and preview container 1215) overlaying the current container arrangement. The container logic 140 provides an educated guess as to how the user intends to re-arrange the containers. In this example, all of the preview containers 1205, 1210, and 1215 are resized relative to the current containers 'A,' 'B,' and 'C.' Alternatively, the container 'C' (i.e., the container being dragged) can retain its current size and shape, and any other containers (e.g., containers 'A' and 'B') can be resized and/or repositioned in the preview to accommodate the current size and shape of container 'C.'

Figure 13:
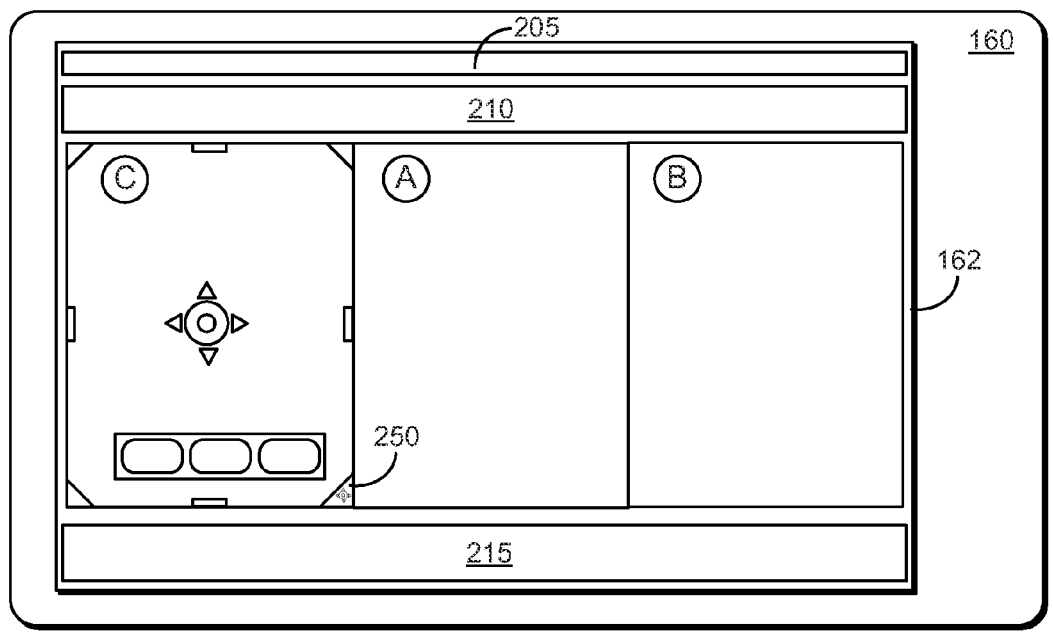

Referring now to FIGS. 12 and 13, the container logic 140 can detect a dropping indication or gesture. For example, the finger 325 can be lifted from the display (or the mouse un-clicked). In response to the dropping indication, the container arrangement can be snapped to the preview container arrangement. In other words, the container 'C' can automatically take the size, shape and location of the preview container 1205, the container 'A' can automatically take the size, shape and location of the preview container 1210, and the container 'B' can automatically take the size, shape and location of the preview container 1215.

Still in the move mode 144, the user can again move the container 'C' to another location by manipulating the move action icon 305. In addition, the user can operate other move mode controls. Otherwise, if the user is satisfied with the new container arrangement, the user can toggle out of move mode by selecting or pressing the move action corner 250.

Figure 14:
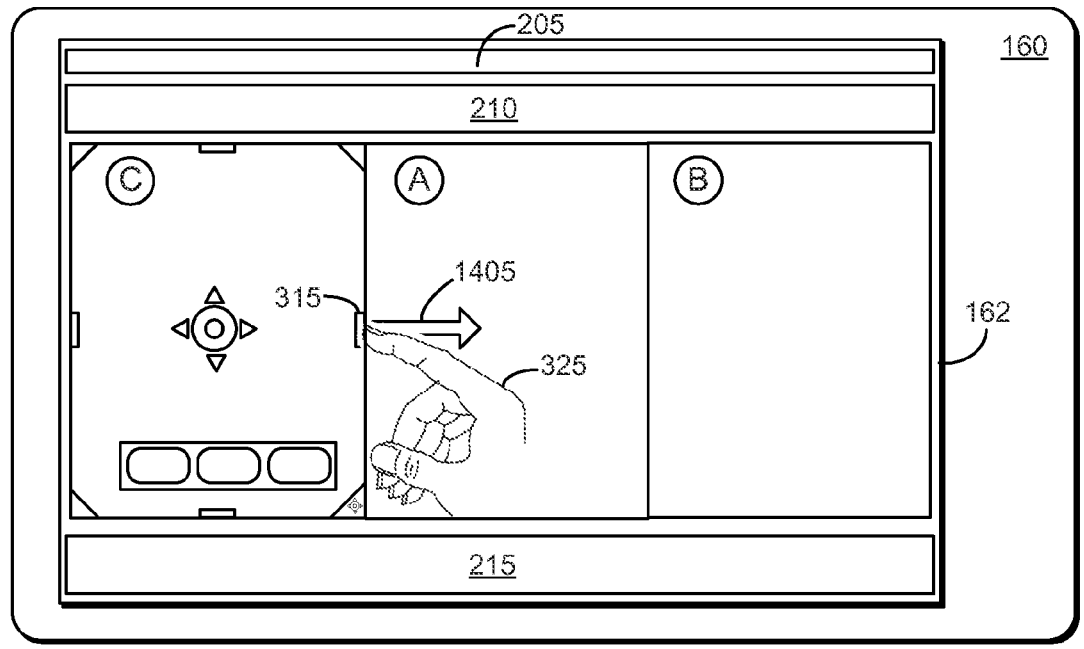

Referring now to FIG. 14, and assuming that the user has not toggled out of the move mode 144, the container logic 140 can detect a selection and dragging gesture 1405 of one of the scale handle icons 315. In response to the selection and the dragging gesture, both of the containers 'C' and 'A' can be graphically scaled simultaneously. Because the container 'B' is not an adjacent container, the size of the container 'B' can remain the same. As mentioned above, all containers are scalable to any suitable size, which allows for flexibility in the layout and the workspace. The layouts need not be fixed to particular options or rigid rules.

Figure 15:
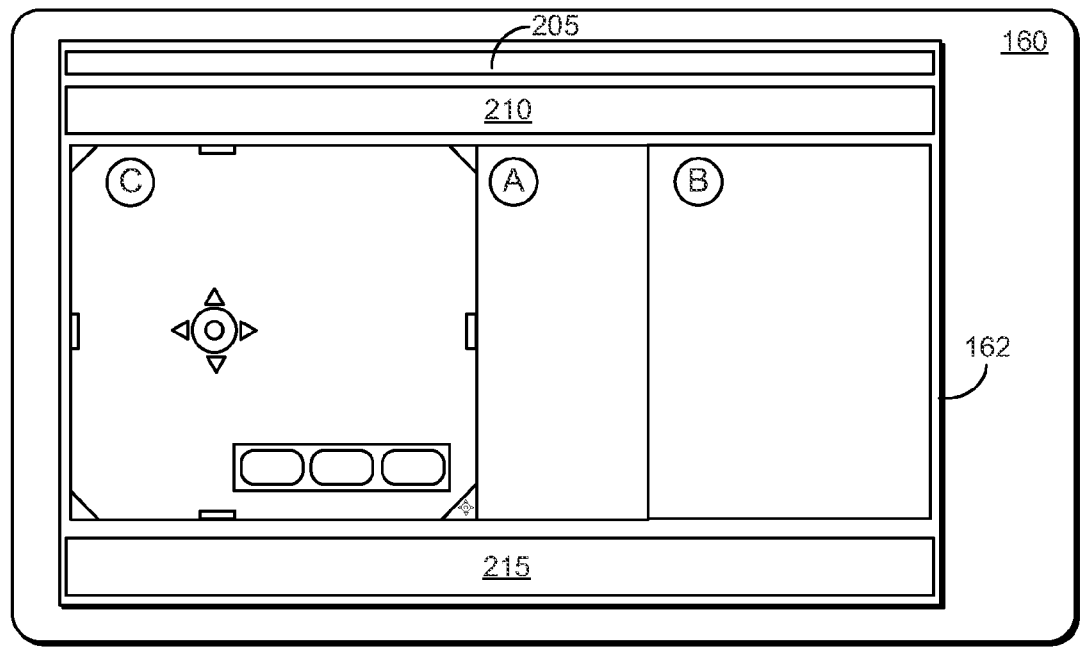

FIG. 15 shows how the containers 'A,' 'B,' and 'C' would appear after the selection and the dragging gesture of the scale handle icon 315. In other words, both the container 'C' and the adjacent container 'A' can be simultaneously scaled in response to the selection and the dragging gesture using the scale handle icon 315.

Figure 16:
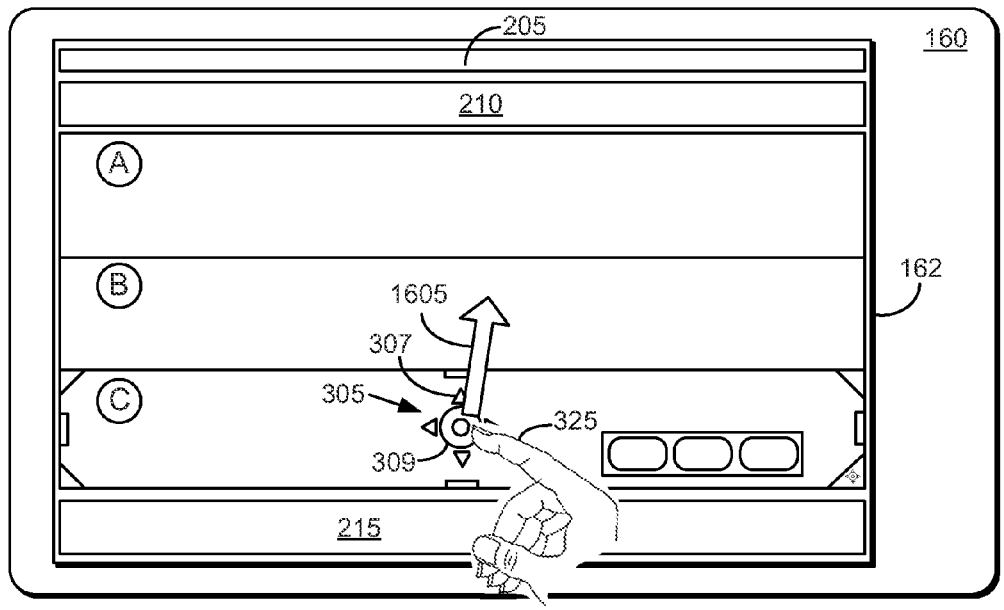

Referring now to FIG. 16, the containers 'A,' 'B,' and 'C' are part of an arrangement of containers in accordance with another embodiment. When in the move mode 144, the container logic 140 can detect a dragging gesture 1605 in a generally upward direction, for example, associated with the container 'C.' For example, the user can press their finger 325 on the center portion 309 of the move control icon 305, and make a dragging gesture substantially perpendicularly toward an adjacent container.

Figure 17:
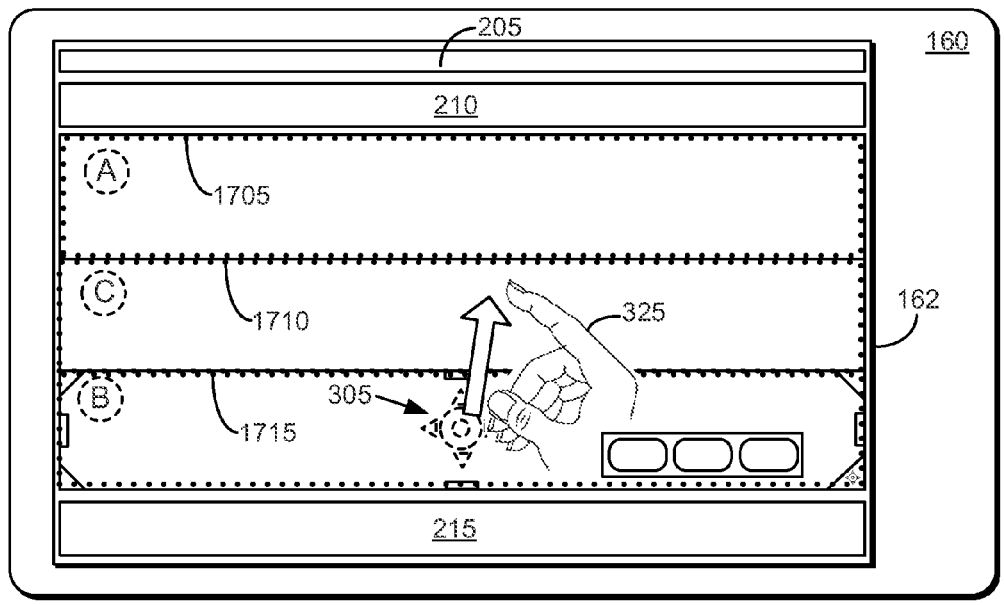

Referring now to FIGS. 16 and 17, in response to the dragging gesture 1605, the container logic 140 can provide a preview container arrangement (e.g., including preview container 1705, preview container 1710, and preview container 1715) overlaying the current container arrangement. The container logic 140 provides an educated guess as to how the user intends to re-arrange the containers. In this example, all of the preview containers 1705, 1710, and 1715 retain their current size relative to the current containers 'A,' 'B,' and 'C.' Alternatively, the container 'C' (i.e., the container being dragged) can retain its current size and shape, and any other containers (e.g., containers 'A' and 'B') can be resized and/or repositioned in the preview to accommodate the current size and shape of container 'C.'

In an alternative embodiment, the container logic 140 can detect a selection of the graphical arrow portion 307, which can immediately cause the container 'C' to swap with an adjacent container 'B' in response to the selection. In this manner, the dragging gesture need not be employed. It will be understood that the various arrow portions 307 can be used to swap with other adjacent containers, whether they be located above, beneath, to the left of, or to the right of, the currently selected container.

Figure 18:
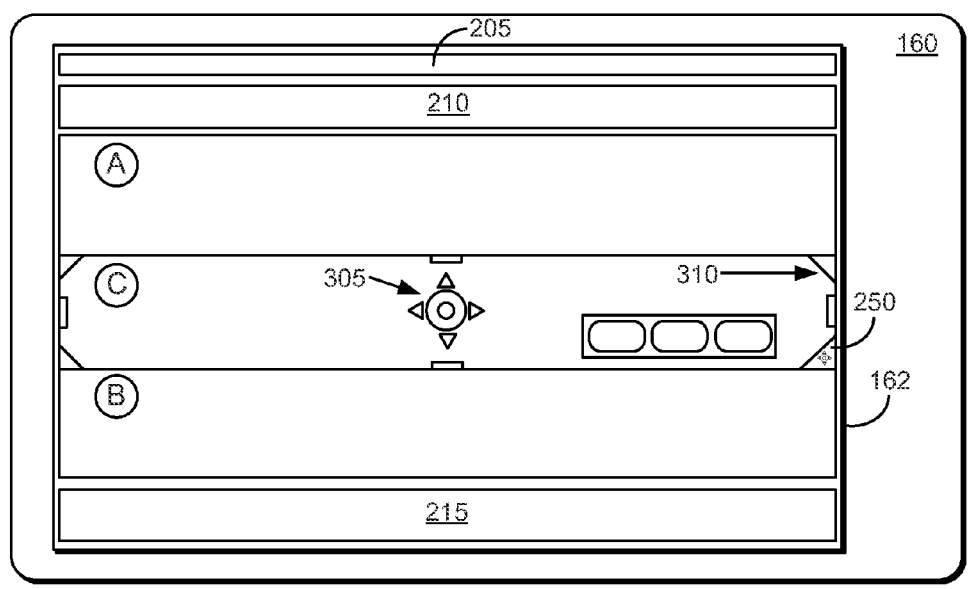

Referring now to FIGS. 17 and 18, the container logic 140 can detect a dropping indication or gesture. For example, the finger 325 can be lifted from the display (or the mouse un-clicked). In response to the dropping indication, the container arrangement can be snapped to the preview container arrangement. In other words, the container 'C' can automatically take the size, shape and location of the preview container 1710, the container 'A' can automatically take the size, shape and location of the preview container 1705, and the container 'B' can automatically take the size, shape and location of the preview container 1715.

Still in the move mode 144, the user can again move the container 'C' to another location by manipulating the move action icon 305. In addition, the user can operate other move mode controls. Otherwise, if the user is satisfied with the new container arrangement, the user can toggle out of move mode by selecting or pressing the move action corner 250.

As mentioned above, the scale corner handles 310 can be used in a similar way as the scale handle icons 315. For example, the scale corner handles 310 can be selected and dragged in any direction (e.g., up, down, left, right, diagonal) in order to resize the associated container(s). Any adjacent container can be automatically and simultaneously resized relative to the dragging of the scale corner handle(s) 310 of the presently selected container. The lower right hand scale corner handle 310 can double as the move action corner 250. In other words, the lower right hand corner can function as the move action corner 250, a scale corner handle 310, or both.

Although the example embodiments described above and illustrated show techniques for intuitively providing a user interface with docked windows or containers, the inventive techniques are also applicable to cases where the containers are undocked from the workspace. The container logic 140 can detect an undock indication, through the selection of a button within the container, from the menu region, or the like. The containers can then be undocked in response to the undock indication.

The container logic 140 can detect a selection and dragging gesture associated with the undocked container. In response to the selection and the dragging gesture, the undocked container can be moved to the external display (e.g., external display 180 of FIG. 1) or otherwise to a different location on the display unit 160 that is integrated with the test and measurement instrument 105.

The embodiments described herein allow the user to easily adjust all aspects of the size and placement of the containers. The user can arrange the containers according to their personal preferences for how they view their acquired signals and associated information based on their tasks at hand. Because there may be multiple layouts that the user may want to use dependent upon a particular task, or because of multiple users sharing the oscilloscope, the capability is provided to save layouts, which allow users to quickly and easily arrange the display as desired.

It will be understood that the determinations and operations illustrated in the diagrams described above need not occur in the specific order as described, but rather, these determinations and operations can be made at different times. It will also be understood that the steps described in these techniques need not necessarily occur in the order as illustrated or described.

Although the foregoing discussion has focused on particular embodiments, other configurations are contemplated. The following discussion is intended to provide a brief, general description of a suitable machine or machines in which certain aspects of the inventive concept can be implemented. Typically, the machine or machines include a system bus to which is attached processors, memory, e.g., random access memory (RAM), read-only memory (ROM), or other state preserving medium, storage devices, a video interface, and input/output interface ports. The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like. The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciate that network communication can utilize various wired and/or wireless short range or long range carriers and protocols, including radio frequency (RF), satellite, microwave, Institute of Electrical and Electronics Engineers (IEEE) 545.11, Bluetooth®, optical, infrared, cable, laser, etc.

Embodiments of the inventive concept can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access. Embodiments of the inventive concept may include a non-transitory machine-readable medium comprising instructions executable by one or more processors, the instructions comprising instructions to perform the elements of the inventive concept as described herein.

Other similar or non-similar modifications can be made without deviating from the intended scope of the inventive concept. Accordingly, the inventive concept is not limited except as by the appended claims.

What is claimed is:

1. A method for providing a user interface on a test and measurement instrument, the method comprising:
    providing a container in the user interface with one or more real time and/or stored objects located within the provided container;
    providing a work mode in which interactions with the provided container and the one or more real time and/or stored objects located within the provided container on a display are allowed;
    providing a move mode in which interactions with the provided container are allowed and an end-user selection of the one or more real time and/or stored objects located within the provided container on the display is temporarily prevented;
    when in the move mode, providing a move control icon within the provided container, wherein the move control icon comprises a graphical center portion and graphical arrow portions;
    detecting a selection and a movement of the graphical center portion;
    moving the provided container from a first location on the display to a second location on the display in response to detecting the selection and the movement of the graphical center portion; and
    based on the moving of the provided container, automatically arranging one or more additional containers.

2. The method of claim 1, wherein the provided container is part of a container arrangement of the provided container and one or more additional containers, the method further comprising:
    when in the move mode, detecting a dragging gesture associated with the provided container; and
    in response to the dragging gesture, providing a preview container arrangement overlaying the container arrangement.

3. The method of claim 2, further comprising:
    detecting a dropping indication; and
    when in the move mode, snapping the container arrangement to the preview container arrangement in response to the dropping indication.

4. The method of claim 2, wherein the display is a touch-sensitive display, and detecting the dragging gesture further comprises detecting, from the end-user, the dragging gesture via the touch-sensitive display.

5. The method of claim 2, wherein detecting the dragging gesture further comprises detecting a mouse gesture from the end-user.

6. The method of claim 1, further comprising:
    detecting a selection of one of the graphical arrow portions; and
    swapping the provided container with an adjacent container in response to the selection of the graphical arrow portion.

7. The method of claim 1, further comprising: providing the graphical center portion in a center region of the provided container.

8. The method of claim 1, further comprising:
    detecting a toggle indication; and toggling between the work mode and the move mode in response to the toggle indication.

9. The method of claim 8, further comprising:
when in the move mode, providing a move action corner within the provided container; and
wherein detecting the toggle indication comprises detecting a selection of the move action corner.

10. The method of claim 9, further comprising:
displaying the move action corner in a corner region of the provided container.

11. The method of claim 1, further comprising:
when in the move mode, providing one or more scale handle icons within the provided container;
detecting a selection and a dragging gesture of at least one of the one or more scale handle icons; and
in response to the selection and the dragging gesture, graphically scaling the provided container.

12. The method of claim 11, wherein:
graphically scaling the provided container includes simultaneously scaling an adjacent container.

13. The method of claim 1, further comprising:
when in the move mode, providing one or more button icons within the provided container;
detecting a selection of the one or more button icons; and
in response to the button selection, performing an action on the provided container.

14. The method of claim 1, further comprising:
saving a container arrangement in response to a save indication, the container arrangement including at least the provided container and a second container; and
recalling the container arrangement in response to a recall indication.

15. The method of claim 1, further comprising:
detecting an undock indication; and
undocking the provided container in response to the undock indication.

16. The method of claim 15, wherein the display is a first display that is integrated within the test and measurement instrument, the method further comprising:
detecting a selection and a dragging gesture associated with the undocked container; and
moving the undocked container to a second display that is external to the test and measurement instrument in response to the selection and the dragging gesture.

17. A test and measurement instrument, comprising:
a display; and
a controller including container logic configured to manage one or more containers of a user interface on the display, the one or more containers including one or more objects located within the one or more containers,
wherein the container logic is configured to:
provide a work mode in which interactions with the one or more containers and the one or more objects within the one or more containers on the display are allowed,
provide a move mode in which interactions with the one or more containers are allowed and an end-user selection of the one or more objects located within the one or more containers on the display is temporarily prevented,
when in the move mode, provide a move control icon within a selected container of the one or more containers, wherein the move control icon further comprises a graphical center portion and graphical arrow portions;
detect a selection and a movement of the graphical center portion;

move the selected container to a different container location in response to the selection and the movement of the graphical center portion; and
automatically arrange the one or more containers based on the different container location of the selected container.

18. The test and measurement instrument of claim 17, wherein:
the one or more containers are part of a container arrangement;
the container logic, when in the move mode, is further configured to
detect a dragging gesture associated with the one or more containers; and
provide a preview container arrangement overlaying the container arrangement based on the dragging gesture.

19. The test and measurement instrument of claim 18, wherein:
the container logic, when in the move mode, is further configured to:
detect a dropping indication; and
in response to the dropping indication, snap the container arrangement to the preview container arrangement.

20. The test and measurement instrument of claim 18, wherein:
the display is a touch-sensitive display; and
the container logic is further configured to detect, from an end-user, the dragging gesture via the touch-sensitive display.

21. The test and measurement instrument of claim 18, wherein
the container logic is further configured to:
save the container arrangement in response to a save indication; and
recall the container arrangement in response to a recall indication.

22. The test and measurement instrument of claim 17, wherein the container logic is further configured to:
detect a selection of one of the graphical arrow portions; and
swap the selected container with an adjacent container based on the graphical arrow portion selected.

23. The test and measurement instrument of claim 17, wherein the container logic is further configured to cause the graphical center portion to be displayed in a center region of the selected containers.

24. The test and measurement instrument of claim 17, wherein the container logic is further configured to:
display a move action corner in a corner region of each of the one or more containers;
receive a toggle indication by detecting a selection of the move action corner of the selected container; and
in response to the toggle indication, toggle from the work mode to the move mode or vice versa.

25. The test and measurement instrument of claim 17, wherein the container logic is further configured to:
display one or more scale handle icons within the one or more containers;
detect a selection and a dragging gesture of at least one of the one or more scale handle icons; and
graphically scale the one or more containers in response to the selection and the dragging gesture.

26. The test and measurement instrument of claim 17, further comprising:

one or more buttons disposed within the one or more containers, wherein the container logic is configured to detect a selection of the one or more button icons, and to perform an action on the one or more containers in response thereto.

27. The test and measurement instrument of claim 17, wherein:
the display is a first display integrated within the test and measurement instrument; and
the container logic is further configured to:
detect an undock indication and to undock the selected container in response thereto;
detect a selection and a dragging gesture associated with the undocked container; and
move the undocked container to a second display that is external to the test and measurement instrument in response thereto.

28. One or more non-transitory computer-readable media having instructions embodied thereon, which, when executed by a test and measurement instrument, cause the test and measurement instrument to:
provide a container on a display associated with the test and measurement instrument with one or more real time and/or stored objects located within the container;
provide a work mode in which interactions with the container and the one or more real time and/or stored objects located within the container on the display are allowed;
provide a move mode in which interactions with the container are allowed and an end-user selection of the one or more real time and/or stored objects located within the container on the display is temporarily prevented;
when in the move mode, provide a move control icon within the container, wherein the move control icon comprises a graphical center portion and graphical arrow portions;
detect a selection and a movement of the graphical center portion;
move the container to a location on the display in response to detecting the selection and the movement of the graphical center portion; and
based on the moving of the container, automatically arrange one or more additional containers.

* * * * *